United States Patent
Savage et al.

(10) Patent No.: US 7,360,178 B2
(45) Date of Patent: *Apr. 15, 2008

(54) MIXED-SIGNAL FUNCTIONS USING R-CELLS

(75) Inventors: Scott C. Savage, Fort Collins, CO (US); Donald T. McGrath, Fort Collins, CO (US); Robert D. Waldron, Fort Collins, CO (US); Kenneth G. Richardson, Erie, CO (US)

(73) Assignee: LSI Logic Corporation, Milpitas, CA (US)

( * ) Notice: Subject to any disclaimer, the term of this patent is extended or adjusted under 35 U.S.C. 154(b) by 219 days.

This patent is subject to a terminal disclaimer.

(21) Appl. No.: 11/136,180

(22) Filed: May 24, 2005

(65) Prior Publication Data

US 2006/0271901 A1    Nov. 30, 2006

(51) Int. Cl.
*G06F 17/50* (2006.01)
(52) U.S. Cl. .................................................. 716/1
(58) Field of Classification Search .............. 716/1–18, 716/19, 20, 21; 257/207; 327/333
See application file for complete search history.

(56) References Cited

U.S. PATENT DOCUMENTS

| 5,822,214 A * | 10/1998 | Rostoker et al. ............. 716/10 |
| 5,831,437 A * | 11/1998 | Ramadoss et al. .......... 324/537 |
| 6,232,818 B1 * | 5/2001 | Zaliznyak .................... 327/333 |
| 6,536,028 B1 * | 3/2003 | Katsioulas et al. ........... 716/17 |
| 6,617,621 B1 * | 9/2003 | Gheewala et al. .......... 257/207 |
| 6,823,499 B1 * | 11/2004 | Vasishta et al. ................ 716/7 |
| 7,043,713 B2 * | 5/2006 | Osann et al. ................. 716/19 |
| 2004/0225991 A1 * | 11/2004 | Fitzhenry et al. ............. 716/13 |
| 2005/0034094 A1 * | 2/2005 | Madurawe .................... 716/12 |
| 2005/0257177 A1 * | 11/2005 | Chen et al. ..................... 716/1 |

* cited by examiner

*Primary Examiner*—Paul Dinh
*Assistant Examiner*—Nha Nguyen
(74) *Attorney, Agent, or Firm*—Christopher P. Maiora

(57) ABSTRACT

A method for producing a chip is disclosed. A first step of the method may include fabricating the chip only up to and including a first metal layer such that a core region of the chip has an array of cells, each of the cells having a plurality of transistors. A second step generally involves designing a plurality of upper metal layers above the first metal layer in response to a custom design created after the first fabricating has started, the upper metal layers interconnecting a plurality of the cells to form (i) a mixed-signal module and (ii) a digital module, the mixed signal module generating at least one analog signal and at least one digital signal. In a third step, the method may include fabricating the chip to add the upper metal layers.

15 Claims, 5 Drawing Sheets

MIXED-SIGNAL FUNCTIONS USING R-CELLS

FIELD OF THE INVENTION

The present invention relates to a method of producing an integrated circuit generally and, more particularly, to a chip implementing mixed-signal function using R-cells.

BACKGROUND OF THE INVENTION

In a field programmable gate array (FPGA) or an application specific integrated circuit (ASIC) platform, mixed-signal functions are conventionally implemented in a pre-diffused region specifically allocated for mixed-signal modules. For example, if a data converter (i.e., an analog-to-digital converter or a digital-to-analog converter) is incorporated into an FPGA or ASIC platform, a specific set of transistors, resistors and capacitors are allocated to implement the data converter. The pre-diffused region (i.e., specific set of transistors, resistors and capacitors) is solely used for the data converter function and other mixed-signal functions. If the data converter function is not used in a particular construct of the FPGA or ASIC, the pre-diffused region (specific set of transistors, resistors and capacitors) is wasted space unusable for other functions.

SUMMARY OF THE INVENTION

The present invention concerns a method for producing a chip. A first step of the method may include fabricating the chip only up to and including a first metal layer such that a core region of the chip has an array of cells, each of the cells having a plurality of transistors. A second step generally involves designing a plurality of upper metal layers above the first metal layer in response to a custom design created after the first fabricating has started, the upper metal layers interconnecting a plurality of the cells to form (i) a mixed-signal module and (ii) a digital module, the mixed signal module generating at least one analog signal and at least one digital signal. In a third step, the method may include fabricating the chip to add the upper metal layers.

The objects, features and advantages of the present invention include providing a chip implementing mixed-signal function using R-cells that may (i) save space by implementing only mixed-signal modules incorporated in a design, (ii) provide additional space for custom functionality by eliminating predefined fixed mixed-signal functions and/or (iii) provide flexibility in a layout of a chip.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

R-cells of a chip (or slice) generally have a few thin-oxide n-channel and p-channel transistors. The R-cells may be replicated 100,000s to 1,000,000s times in a core region of the chip. The abundant R-cells may be configured to create mixed-signal functions (e.g., both analog and digital signals) where digital functions (e.g., flip-flops, logical AND gates, logical OR gates, logical NOR gates, etc.) usually exist. For example, data converters generally comprise a few blocks that may be replicated in proportion to an intended resolution. A 6-bit digital-to-analog (DAC) converter may have 64 ($2^6$) individual current sources that form most of the DAC. Hence, a unit current source may be created out of one or more R-cells and the unit current source structure replicated 64 times to create the majority of the DAC.

Mixed-signal modules comprising R-cells may be created anywhere within an R-cell fabric, rather than a diffused core specifically allocated for mixed-signal modules. The ability to create mixed-signal intellectual property devices with R-cells generally allows for a more diverse product listing for an ASCI or FPGA. The ability to implement with R-cells may save area and/or cost in the ASIC and/or FPGA designs since the R-cells may be used for other functions (e.g., digital functions) if the mixed-signal function is not used in a particular construct of the FPGA or ASIC. The ability to use R-cells for digital, mixed-signal and analog functions generally saves the customer costs by allowing to integrate lower occurrence functions on chip rather than using an external component. Finally, mixed-signal IP may be placed anywhere in the core region allowing for more layout flexibility.

The mixed-signal functions may be constructed in the core region using the cells designated for digital functions. The approach generally saves space since the R-cell area may be used for more functions (both mixed-signal and digital). The approach may also add value to a product line offering by a vendor. Many possible modules and functions may be created in the same manner. Example functions include, but are not limited to, analog-to-digital (ADC) converters, digital-to-analog (DAC) converters, phase locked loops (PLL), delay locked loops (DLL), filters and power-on-reset functions.

Figure 1:
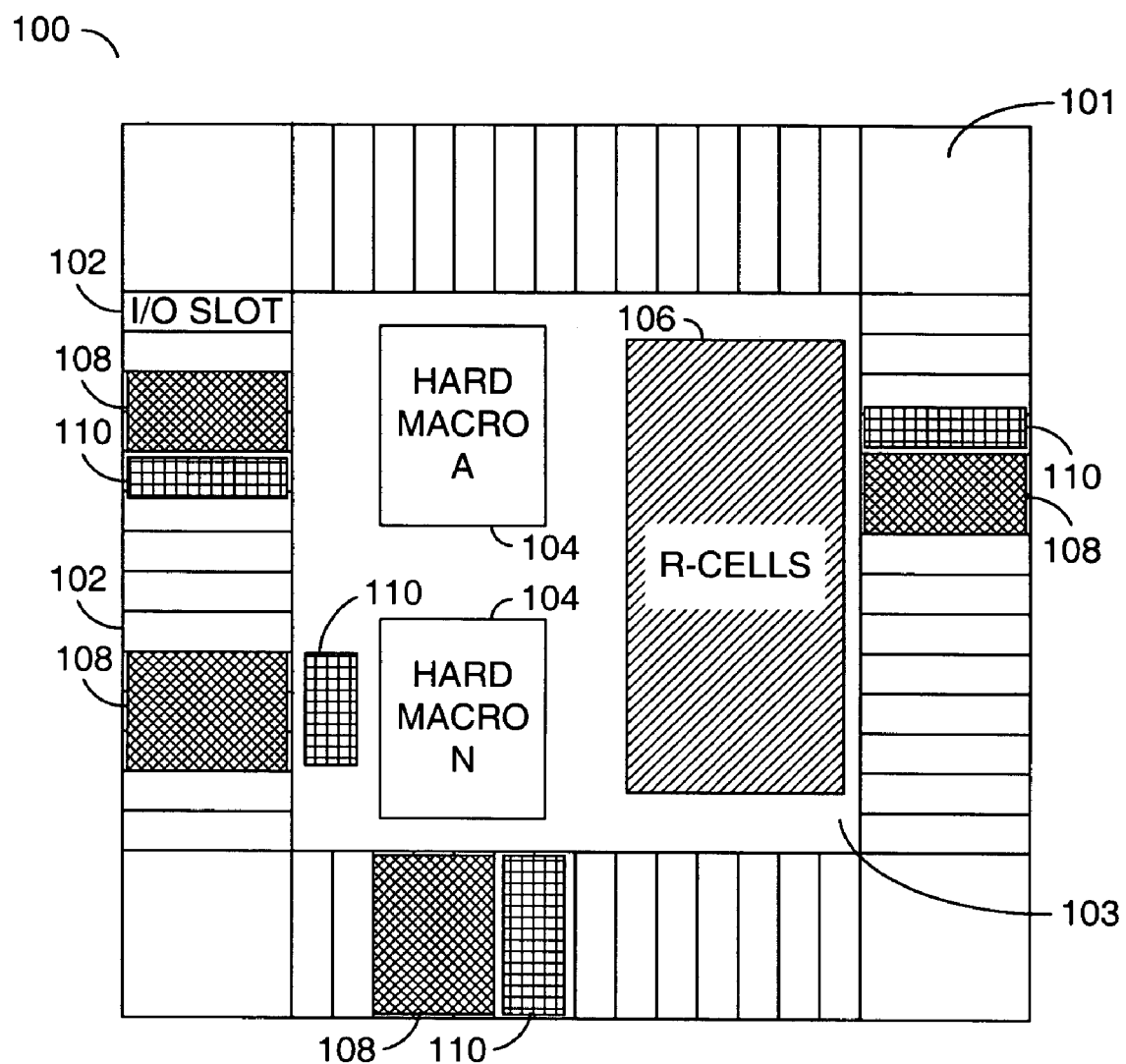
FIG. 1 is a block diagram illustrating a platform application specific integrated circuit in accordance with a preferred embodiment of the present invention.

Referring to FIG. 1, a block diagram of a programmable platform device (or die, or chip, or slice) 100 is shown in accordance with one or more preferred embodiments of the present invention. The slice 100 may be implemented, in one example, as a partially manufactured semiconductor device (e.g., a platform application specific integrated circuit (platform ASIC)) in which all of the silicon layers (or base layers) have been fabricated (e.g., a first processing or pre-inventory phase), but where customization of the slice 100 may be performed later (e.g., a second processing or completed phase) via one or more upper metal layers.

In one example, a number of slices 100 may be fabricated having different varieties and/or numbers of intellectual property (IP) blocks, diffused memories, etc. By fabricating a variety of slices with a variety of IP blocks and diffused memories, a wide variety of applications may be supported. For example, a particular slice 100 may be selected for customization later because the particular IP blocks implemented are suitable for a customized application. By deferring customization of the slice 100, a manufacturer may have flexibility to keep an inventory of mostly complete slices 100 that may be customized for a variety of applications. The IP blocks may comprise, for example, hard IP, soft IP and/or firm IP. Hard IP may be diffused at optimal locations within a slice using cell-based elements for maximum performance and density (e.g., embedded processors, transceivers, etc.). Soft IP may be incorporated into a slice as a function block. Soft IP may be implemented similarly to other blocks in a design (e.g., with specific timing criteria to ensure functionality). Soft IP may be implemented, in one example, as Register Transfer Language (RTL) code. Firm IP generally allows fully routed and characterized high-performance blocks to be implemented in a slice design.

A physical layout of the slice 100 generally comprises a first region 101 and a second region 103. The first region 101 may be defined around a periphery (or outer edge) of the slice 100 where most to all of the input/output (I/O) circuits may be located. As such, the first region 101 may be referred to as an input/output region. The second region 103 may be located inside the input/output region 101. The second region 103 generally contains most or all of the standard library and custom circuitry that make the slice 100 unique. As such, the second region 103 may be referred to as a core region.

The slice 100 may comprise a number of pre-diffused regions. In one example, the slice 100 may comprise a plurality of regions 102, a number of regions 104, and one or more regions 106. The plurality of regions 102 may be located around the periphery (or outer edge) of the slice 100. The regions 102 may be implemented as configurable I/O slots (or ConfigIOs). For example, each of the regions 102 may be configured to couple the core region 103 of the slice 100 to an I/O pin. The regions 104 may be implemented as one or more hard IP blocks (or hard macros). The regions 106 may be implemented as one or more customizable regions. In one example, the customizable regions 106 may comprise an R-cell transistor fabric (or array, or matrix). In another example, the customizable regions 106 may be implemented as a gate array region. The regions 102 may be distributed around the input/output region 101 of the slice 100. The regions 104 and 106 may be distributed within the core region 103 of the slice 100.

In one example, the regions 104 may be implemented similarly to an ASIC design. In general, the regions 104 may be configured to provide a number of functions on (in) the slice 100. For example, the regions 104 may comprise phase locked loop (PLLs) blocks (or modules), instances of processor blocks (or modules), input/output physical level (PHY) macro blocks (or modules) and/or any other type of IP block (or module) appropriate to meeting the design criteria of a particular implementation. Soft IP blocks (or modules) and firm IP blocks (or modules) may be implemented in the customizable region 106.

The customizable region 106 may be configured by a customer (e.g., by a custom design of one or more metal layers), in one example, as logic and/or memory. For example, the region 106 may be implemented as sea-of-gate arrays. In one example, the region 106 may be implemented as an R-cell transistor fabric comprising a number of R-cells. The term R-cell generally refers to an area of silicon designed (or diffused) to contain multiple transistors that have not yet been personalized (or configured) with metal layers. Wire (or trace) layers may be added for interconnecting the R-cells to make particular transistors, logic gates, soft IP blocks, firm IP blocks, mixed-signal modules and/or storage elements. For example, the R-cells in the region 106 may be customized to build non-diffused memories or other circuits for a particular application. A region 106 filled with thousands of R-cells may be referred to as an R-cell fabric 106.

An R-cell generally comprises multiple diffusions, a gate layer and a metal layer for forming the parts of n-type and p-type transistors and the contact points where upper metal layers may be attached in subsequent manufacturing steps (e.g., to power, ground, inputs and outputs). For example, each R-cell may be implemented as a five-transistor cell, which includes two n-channel metal oxide semiconductor field effect transistors (NMOS devices), two p-channel MOSFET transistors (PMOS devices) and a small PMOS device. In general, the R-cells may be, in one example, building blocks for logic, mixed-signal and/or storage elements. The R-cells may be diffused in a regular pattern throughout a slice. For example, one way of designing a chip that performs logic and storage functions may be to lay down numerous (identical) R-cells row after row, column after column to form a matrix or array of cells. A large area of the slice 100 may be devoted to nothing but R-cells. The R-cells may be personalized (or configured) in subsequent production steps (e.g., by depositing and patterning upper metal layers) to provide particular logic functions. The logic functions may be further wired together (e.g., a gate array design).

Prior to customization, the regions 102 and 106 may comprise generic pre-diffused regions that may provide a rich set of devices (e.g., transistors, resistors, capacitors, etc.). A number of different generic pre-diffused regions may be implemented (e.g., CONFIGIO1, CONFIGIO2, etc.). In one example, a number of types of transistors (e.g., N and P, TO, ATO, HP, etc.) may be implemented in each of the regions 102. Some example types and numbers of devices that may be implemented in the regions 102 may be summarized in the following TABLE 1:

TABLE 1

| CONFIGIO2 | | CONFIGIO1 | |
|---|---|---|---|
| Device Type | Number of R-cells | Device Type | Number of R-cells |
| pm_hp | 401 | pm_hp | 178 |
| pm_ato | 2048 | pm_ato | 470 |
| nm_ato | 129 | nm_to | 66 |
| nm_aton | 84 | nm_esd | 12 |
| nm_esd | 16 | resistors | 21 |
| nm_hp | 372 | | |
| nm_to | 1798 | | |
| resistors | 84 | | |

However, it will be understood by those skilled in the art that other types and/or numbers of devices may be implemented without departing from the spirit and scope of the present invention.

Some examples of mixed-signal functions that may be fabricated in the R-cell fabric 106 may be summarized in the following TABLE 2:

TABLE 2

| Circuit | # of Slots | Applications | Function |
|---|---|---|---|
| PLL/DLL (500 MHZ range or less | 5-6 | Clock multipliers, clock-data deskew | Clock generation |

TABLE 2-continued

| Circuit | # of Slots | Applications | Function |
|---|---|---|---|
| Temperature Sensor (+/− 10-15 degree C. accuracy) | 2-3 | Cabinet design, package selection verification, system testing, reliability verification | Provides digital output proportional to die temperature |
| Voltage regulator | 1-2 | Any product that employs dual voltages | Generates 1.2 V, 1.8 V, or 2.5 V supply from 2.5 V or 3.3 V supply. May use external pass device |
| Power On Reset (POR) | 1-2 | May be employed in any electronic product or system | Signals when I/O or core voltages are at valid levels |
| 8-10 bit, 1 Msps ADC | 3-5 | Tape/disc drive servos, MP3 players, digital cameras, wireless devices, fish finders, featurized phones, circuit breakers, process controllers | Sensor interface (temperature, touchpanel, battery monitor, vibration, humidity, position, other), RSSI, control systems |
| 12-14 bit, 20 Ksps Sigma-delta ADC | 1-3 | Circuit breakers, power meters, instrumentation, voice encoders, motor diagnostics, medical devices, process controllers | Sensor interface (temperature, touchpanel, battery monitor, vibration, humidity, position, other) |
| 8-bit, 10 Msps DAC | 2-3 | Motion control, process control, Tape/disc servos, digital trimming | Actuation and control |
| 32 KHz-50 MHz Crystal Oscillator | 2 | Any application where a system clock is not always available: MP3 players, digital cameras, wireless devices, fish finders, featurized phones, circuit breakers | Generates a clock at a specified frequency set by the crystal |
| Filter (SC, CT) | 1-5 | Tape read-channels, voice encoders, instrumentation, circuit breakers | Conditions as analog signals |

However, other building blocks (or circuits) may be implemented accordingly to accomplish custom analog functions. For example, other building blocks may include, but are not limited to, operational amplifiers, comparators, analog multiplexers, analog switches, voltage/current reference. The R-cell fabric 106 may also be used to implement sub-functions (e.g., the circuitry 110) of the functions 108 (e.g., switched capacitor filters, gm/C filters, data converters, etc.).

The devices implemented in the slice 100 may be programmed by defining metal mask sets. In one example, metal-insulator-metal capacitors (e.g., approximately one picofarad (pF) per slot) may be formed in the regions 102 and/or 106. In one example, more than one of the regions 102 may be combined (e.g., coupled together via routing) to implement more complex functions. For example, metal mask sets may be placed over two or more of the generic pre-diffused regions 102 to form a relocatable multi-slot function 108. The relocatable multi-slot function 108 may be described as a relocatable function. The term relocatable is used as a general term to indicate that the function may be located (or configured) in a number of locations around the slice 100. While the final result would be that the function 108 would be located in different locations, different pre-diffused areas may be used to implement the function 108 in the different locations. Also, one or more of the functions 108 may be implemented throughout the plurality of regions 102 and/or 106. The functions 108 may be configured to provide analog functions, digital functions or mixed-signal functions using metal programmability.

The functions 108 may be enhanced by additional circuitry 110 defined by the customer. The additional circuitry 110 may be constructed without any special diffused circuitry, special process options and/or additional wafer cost. The circuitry 110 may be located on any I/O slot 102 boundary within the input/output region 101 and/or in the R-cell fabric 106 within the core region 103.

Figure 2:
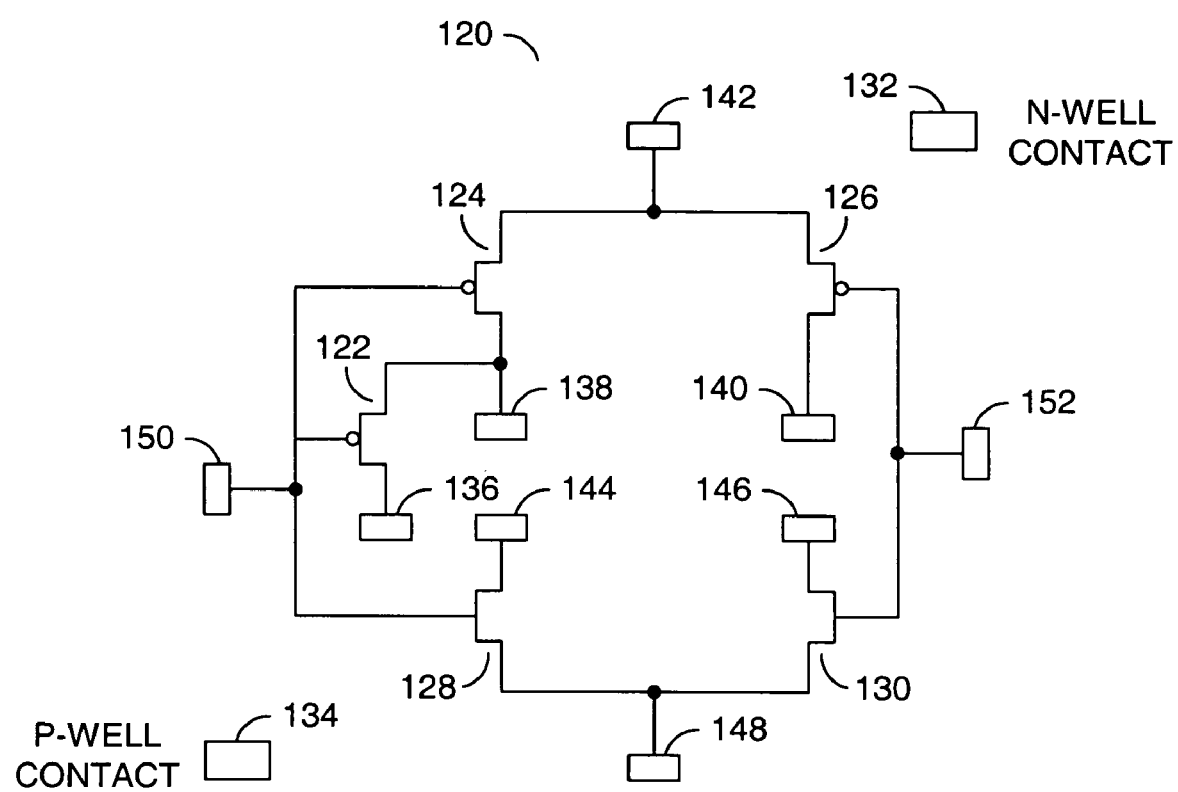
FIG. 2 is a schematic of an example implementation of an R-cell.

Referring to FIG. 2, a schematic of an example implementation of an R-cell 120 is shown in accordance with a preferred embodiment of the present invention. An R-cell 120 generally comprises a transistor 122, a transistor 124, a transistor 126, a transistor 128, a transistor 130, an n-well contact 132, a p-well contact 134, a transistor contact 136, a transistor contact 138, a transistor contact 140, a transistor contact 142, a transistor contact 144, a transistor contact 146, a transistor contact 148, a gate contact 150 and a gate contact 152.

The transistor 122 may be implemented as a p-channel MOSFET. A gate of the transistor 122 may be connected to the gate contact 150. A first node (e.g., source or drain) of the transistor 122 may be connected to the transistor contact 136. A second node (e.g., drain or source) of the transistor 122 may be connected to the transistor contact 138. In one embodiment, a channel width of the transistor 122 may be approximately 0.3 micrometers (um). A channel length of the transistor 122 may be approximately 0.115 um.

The transistor 124 may be implemented as a p-channel MOSFET. A gate of the transistor 124 may be connected to the gate contact 150. A first node (e.g., source or drain) of the transistor 124 may be connected to the transistor contact 138. A second node (e.g., drain or source) of the transistor 124 may be connected to the transistor contact 142. In one embodiment, a channel width of the transistor 124 may be approximately 1.59 um. A channel length of the transistor 124 may be approximately 0.115 um.

The transistor 126 may be implemented as a p-channel MOSFET. A gate of the transistor 126 may be connected to the gate contact 152. A first node (e.g., source or drain) of the transistor 126 may be connected to the transistor contact 140. A second node (e.g., drain or source) of the transistor 126 may be connected to the transistor contact 142. In one embodiment, a channel width of the transistor 126 may be approximately 1.59 um. A channel length of the transistor 126 may be approximately 0.115 um.

The transistor 128 may be implemented as an n-channel MOSFET. A gate of the transistor 128 may be connected to the gate contact 150. A first node (e.g., source or drain) of the transistor 128 may be connected to the transistor contact 144. A second node (e.g., drain or source) of the transistor 128 may be connected to the transistor contact 148. In one embodiment, a channel width of the transistor 128 may be approximately 0.88 um. A channel length of the transistor 128 may be approximately 0.115 um.

The transistor 130 may be implemented as an n-channel MOSFET. A gate of the transistor 130 may be connected to the gate contact 152. A first node (e.g., source or drain) of the transistor 130 may be connected to the transistor contact 148. A second node (e.g., drain or source) of the transistor 130 may be connected to the transistor contact 146. In one embodiment, a channel width of the transistor 130 may be approximately 1.235 um. A channel length of the transistor 130 may be approximately 0.115 um.

The R-cells 120 generally include all fabrication layers between well diffusions and a first metal layer, inclusive.

When initially fabricated, each R-cell is isolated from the neighboring R-cells. Therefore, any particular R-cell may be later connected through one or more upper metal layers to other circuitry (e.g., other R-cells 120, I/O slots 102, hard macros 104, firm macros, soft macros, modules 108 and/or modules 110 within one power domain or crossing between two or more power domains.

Figure 3:
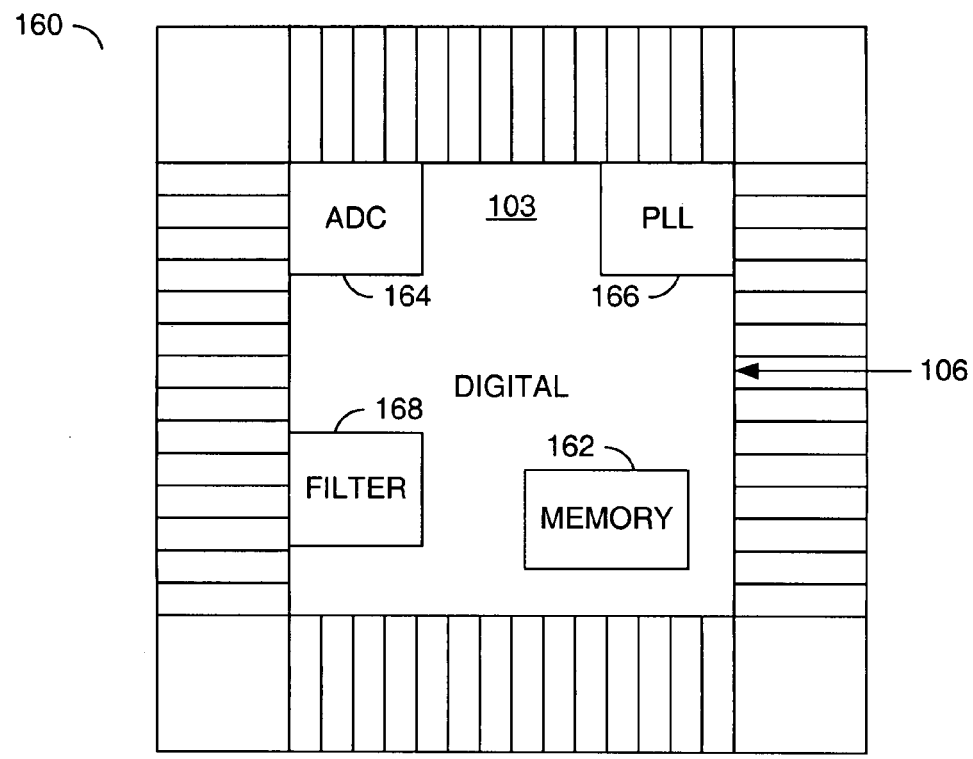
FIG. 3 is a diagram of an example layout of a first slice.

Referring to FIG. 3, a diagram of an example layout of a first slice 160 is shown. The slice 160 generally includes a digital module 162 (e.g., memory), a mixed-signal module 164 (e.g., an analog-to-digital converter (ADC)), a mixed-signal module 166 (e.g., a phase lock loop (PLL)) and an analog module 168 (e.g., filter) within the core region 103. In the example layout, the digital memory module 162 may be implemented using predetermined diffusions, oxides, vias and first metal layer patterns specific to the memory module and thus the memory module 162 may have a fixed location in the core region 103. The ADC module 164, the PLL module 166 and the filter module 168 are generally implemented using predetermined diffusions, oxides, polysilicon, vias and first metal layer patterns specific to the respective modules. Design of the modules 162-168 may include specific transistors, resistors, capacitors, amplifiers, and the like. As such, the ADC module 164, the PLL module 166 and the filter module 168 may have a fixed location in the core region 103 for the particular slice 160. The remaining area of the core region 103 not occupied by the memory module 162, the ADC module 164, the PLL module 166 and the filter module 168. The remaining area (e.g., customizable region 106) may be filled with R-cells to enable customization of the slice 160.

Consider a customer building a circuit based on the slice 160, having the modules 162-168. Each of the predefined modules 162-168 (previously fabricated as part of the slice 160) are generally available for use in the customer's circuit design. Where the design incorporates the modules 162-168, the design time is simplified and space within the core region 103 may be efficiently utilized. Without the present invention, if the customer's design has no use for one or more of the modules 162-168, then the space of the unused modules may be wasted. An unused module 162-168 may remain unconnected to any other circuits in the final design and thus generally does not consume any power.

Figure 4:
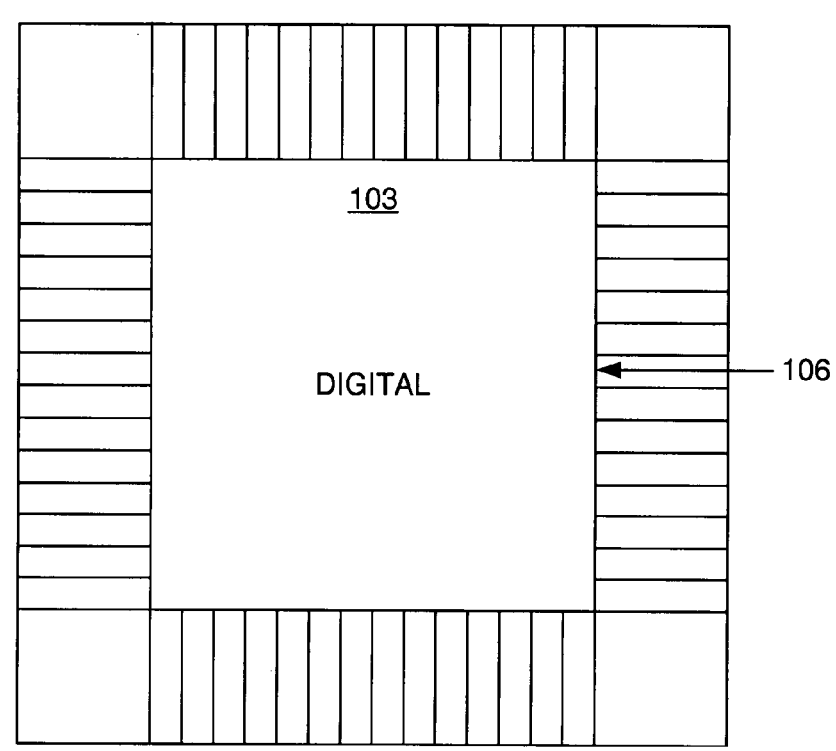
FIG. 4 is a diagram of an example layout of a second slice.

Referring to FIG. 4, a diagram of an example layout of a second slice 170 is shown. The slice 170 may differ from the slice 160 in that the memory module 162, the ADC module 164, the PLL module 166 and the filter module 168 may be absent after fabrication up through the first metal layer. The core region 103 of the slice 170 may have more R-cells than the core region 103 of the slice 160 due to the absence of the modules 162-168 (e.g., a larger region 106). As such, the customer may have more R-cells available in the slice 170 than the slice 160 to implement a design.

Figure 5:
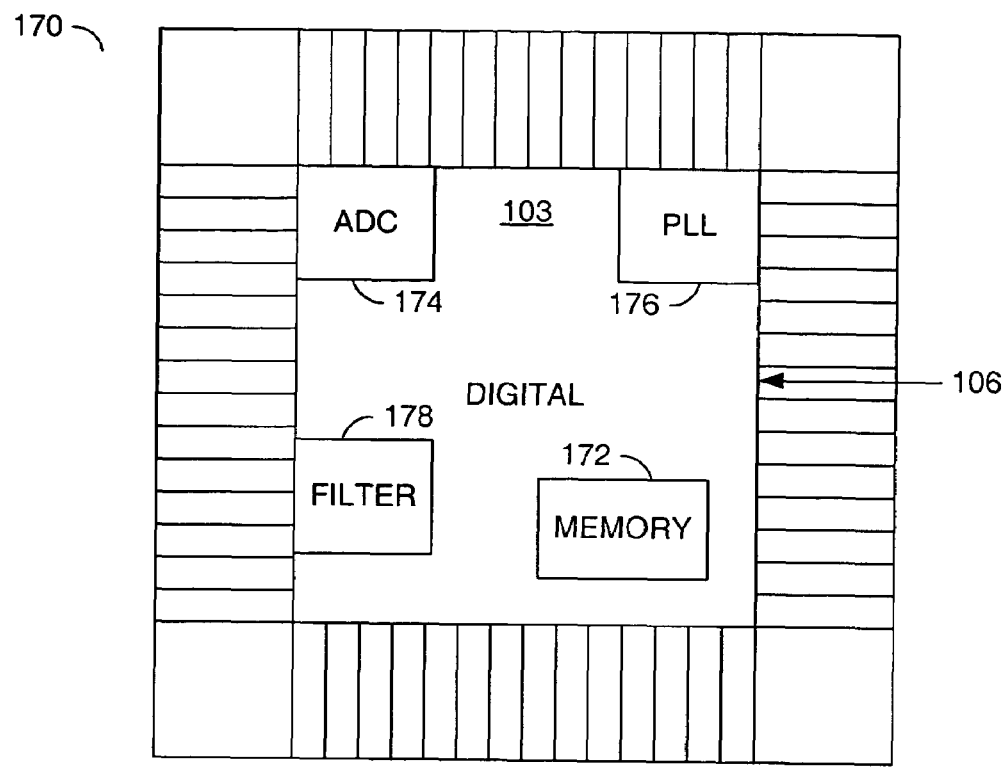
FIG. 5 is a diagram of an initial example placement of various modules within a core region of the second slice.

Referring to FIG. 5, a diagram of a first example placement of various modules within the core region 103 of the second slice 170 is shown. The customer may implement a design using one or more modules (e.g., a memory module 172, an ADC module 174, a PLL module 176 and a filter module 178) that may be functionally similar to the memory module 162, the ADC module 164, the PLL module 166 and the filter module 168. Differences between the modules 162-168 and the modules 172-178 may be found in the implementations of the various fabrication layers constructing 162 168 versus 172-178. In particular, the modules 172-178 may be formed using only R-cells and one or more upper metal layers (e.g., firm IP or soft IP). In contrast, the modules 162-168 may be formed using multiple unique layers (e.g., hard IP). As such, if the customer's design does not utilize any of the modules 172-178, the slice 170 may be completed without the unused modules 172-178 (FIG. 4) thereby saving space in the core region 103. If the customer's design includes one or more of the modules 172-178, the included modules 172-178 may be built in the core region 103 (FIG. 5). If used, the modules 172-178 may have a similar placement in the slice 170 as the modules 162-168 in the slice 160.

Figure 6:
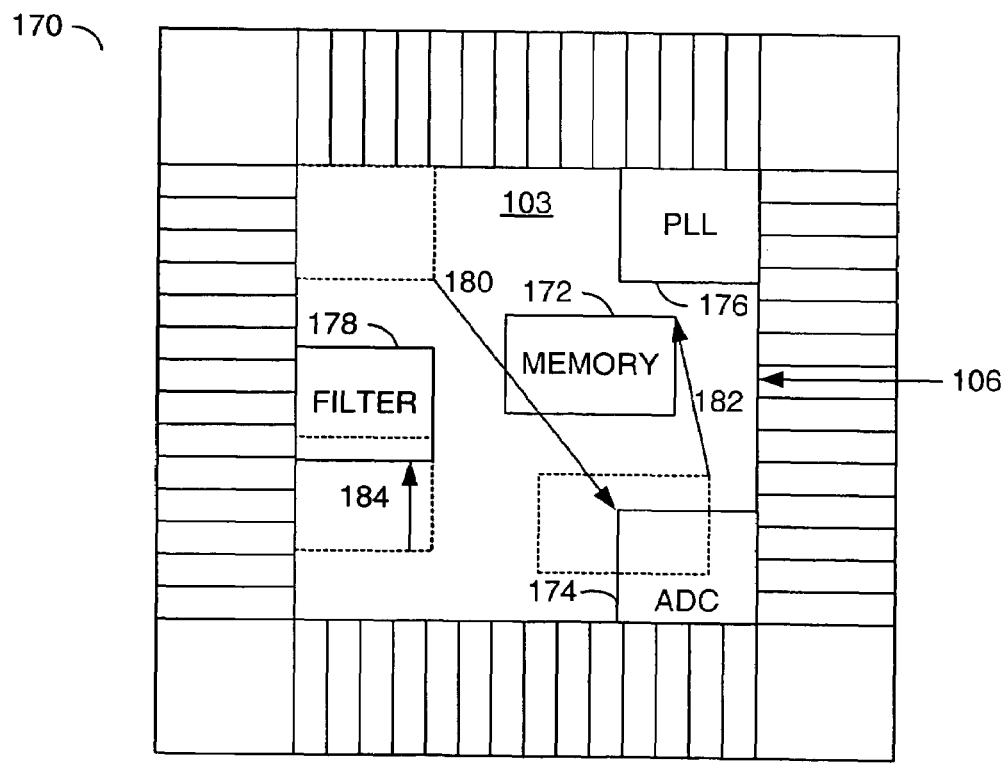
FIG. 6 is a diagram of a final example placement within the second slice.

Referring to FIG. 6, a diagram of a second example placement within the second slice 170 is shown. Placement of the modules 172-178 (and other modules) may be altered during a design cycle. For example, the ADC module 174 may be moved (arrow 180) from an initial location in the upper left-hand corner of the core region 103 to another location in a lower right-hand corner. To make room for the repositioned ADC module 174, the memory module 172 may be moved (arrow 182) from away from the location in the lower right-hand corner to a new location. In a similar manner, the filter module 178 may be moved (arrow 184) upwards slightly to clear the lower left-hand corner of the core region 103. The example movement of the filter module 178 may cause fabrication of the filter module 178 to shift from an initial set of R-cells around the starting location to a final set of R-cells around the ending location. The initial set and the final set of R-cells may be overlapping if the move 184 is short. The initial set and final set of R-cells may be mutually exclusive if the move 184 is sufficient (e.g., the move 180 of the ADC module 174).

Figure 7:
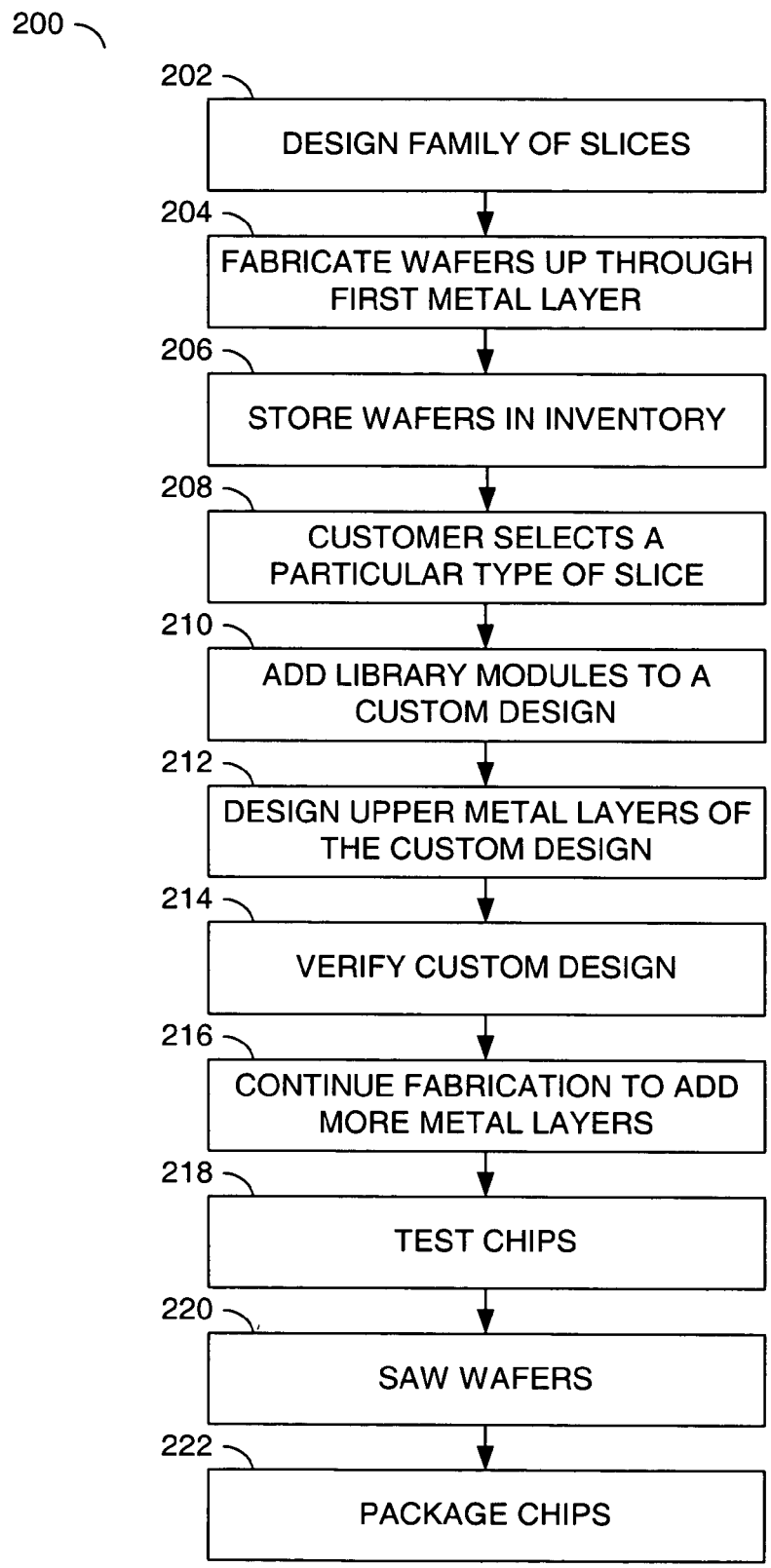
FIG. 7 is a flow diagram of an example method for designing and providing a chip.

Referring to FIG. 7, a flow diagram of an example method 200 for designing and providing a chip is shown. The method 200 generally comprises a step (or block) 202, a step (or block) 204, a step (or block) 206, a step (or block) 208, a step (or block) 210, a step (or block) 212, a step (or block) 214, a step (or block) 216, a step (or block) 218, a step (or block) 220 and a step (or block) 222.

The method (or process) 200 may start with the design of a family of slices (e.g., including slices 100, 160 and 170) in step 202. Each different slice design in the family may include a different assortment of fixed memory blocks (e.g., memory block 162), memory physical interface blocks, communication blocks, clock generation blocks, customizable input/output blocks, fixed design input/output blocks, and/or processor blocks. An initial fabrication may be performed in step 204 to create wafers in each of the families. The wafers may then be placed in storage in step 206 until needed to fill a customer order. Storage may last from days to months, or even longer.

After the wafers have been fabricated, or while the wafers are being fabricated, a customer may begin developing a custom design by selecting one of the members from the slice family as a starting point in step 208. Using the circuitry provided by the selected slice member, the customer may add standard library blocks to the selected slice to increase the functionality in step 210. The standard library blocks may be hard IP, firm IP and/or soft IP that utilize the R-cells 120 and any other undefined elements in the slice to implement a standard function (e.g., processor, PLL, memory, etc.) One or more variations of analog modules (e.g., filter module 178), mixed-signal modules (e.g., ADC module 174) and digital modules (e.g., memory module 172) may be available in the library as a relocatable block. The modules may be positioned in the core region 103 as appropriate.

The customer may continue the development by designing interconnecting traces (or wires) for signals and power in one or more metal (or conductive) layers, starting from the second metal layer and up, in step 212. The design of the upper metal layers may provide connections among the predefined circuitry in the particular slice and the standard library cells added to the slice. The design of the upper metal layers may also be used to create custom circuitry using the R-cells 120. For example, a function unavailable in the library of standard blocks may be synthesized using the transistors in the R-cells 120. The customized modules may include, but are not limited to, analog modules (e.g., filter module 178), mixed-signal modules (e.g., ADC module 174) and digital modules (e.g., memory module 172).

After the custom design has been completed, a verification may be performed in step 214. A variety of commercial tools are generally available to perform verification checks. Any problems identified by the verification may be corrected in the design by returning to the step 212.

Once the verification has been completed, wafers of the selected slice type may be removed from the inventory for additional processing. In step 216, additional metal layers, insulating layers, top coats and the like may be fabricated on the wafers. Limited functional testing of each chip may then be performed in step 218. After testing, the wafers are generally sawed in step 220 to separate the individual chips. Good chips may be packaged in step 222 to create a finished product. The packaged chips may be provided to the customer for additional testing and evaluation.

An advantage of the method 200 may be an ability to place and route analog modules, mixed-signal modules and digital modules anywhere in the core region 103 at any time during the custom design phase since the modules may be formed from the pre-existing R-cells. Therefore, the customer does not have to pay for designing unique layers from the first metal layer downward to create a fully custom mixed-signal module. Furthermore, the creation of the mixed-signal modules from the R-cells does not constrain the initial fabrication phase for the wafers. The R-cell based mixed-signal modules do not force any unique features in the diffusions, polysilicon layer, gate oxides, field oxides, vias and/or the first metal layer. Therefore, the initial fabrication phase may take place before or while the custom design is being developed and the positions of the modules may be uncertain, resulting in a short time between the end of design and completion of prototype parts.

The function performed by the flow diagram of FIG. 7 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMs, EPROMS, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

The invention claimed is:

1. A method for producing a chip, comprising the steps of:
   (A) fabricating said chip only up to and including a first metal layer such that a core region of said chip has an array of cells, each of said cells having a plurality of transistors;
   (B) designing a plurality of upper metal layers above said first metal layer in response to a custom design created after said first fabricating has started, said upper metal layers interconnecting a first plurality of said cells to form (i) a mixed-signal module and (ii) a digital module, said mixed signal module generating at least one analog signal and at least one digital signal; and
   (C) fabricating said chip to add said upper metal layers, wherein (1) said designing comprises the sub-steps of (i) designing a first module at a first location using a second plurality of said cells, (ii) moving said first module away from said first location, (iii) designing a second module at said first location using at least one of said second plurality of said cells and (iv) moving said second module to a second location such that said second module uses a portion of said first plurality of said cells and a third plurality of said cells and (2) each of said cells comprises (i) five of said transistors, (ii) two well contacts and (iii) eleven pads in said first metal layer connected to each node of said transistors and each of said well contacts respectively.

2. The method according to claim 1, wherein step (B) comprises the sub-step of:
   designing said upper metal layers to form an analog module.

3. The method according to claim 2, wherein step (B) comprises the sub-step of:
   designing only said upper metal layers to directly connect said analog module and said mixed-signal module.

4. The method according to claim 1, wherein
   said first module comprises another digital module; and
   said second module comprises an analog module.

5. The method according to claim 1, wherein step (B) comprises the sub-step of:
   designing only said upper metal layers to directly connect said digital module and said mixed-signal module.

6. A method for designing a chip, comprising the steps of:
   (A) selecting a particular chip design from a plurality of chip designs having an array of cells, each of said cells defining a plurality of transistors, said particular chip having an existing design only up to and including a first metal layer;
   (B) adding a plurality of modules from a library to said particular chip design, each of said modules defining a plurality of upper metal layers above said first metal layer that interconnect some of said cells to implement a respective function; and
   (C) designing a plurality of traces in said upper metal layers interconnecting a first plurality of said cells to form (i) a mixed-signal module and (ii) a digital module, said mixed signal module generating at least one analog signal and at least one digital signal and (iii) moving a location of said mixed-signal module such that said mixed-signal module uses a portion of said first plurality of said cells and a second plurality of said cells and (2) each of said cells comprises (i) five of said transistors, (ii) two well contacts and (iii) eleven pads in said first metal layer connected to each node of said transistors and each of said well contacts respectively.

7. The method according to claim 6, wherein step (C) comprises the sub-step of:

designing said upper metal layers to form an analog module.

8. The method according to claim 7, wherein step (C) comprises the sub-step of:

designing only said upper metal layers to directly connect said analog module and said mixed-signal module.

9. The method according to claim 6, wherein step (C) further comprises the sub-steps of:

designing said digital module at a location using a particular at least one of said first plurality of said cells;

moving said digital module away from said location; and designing said mixed-signal module at said location using said particular at least one of said first plurality of said cells.

10. The method according to claim 9, wherein step (C) comprises the sub-step of:

designing only said upper metal layers to directly connect said digital module and said mixed-signal module.

11. The method according to claim 6, wherein each of said cells has:

three of said transistors having a first gate in common and two of said transistors having a second gate in common.

12. A chip comprising:

an array of cells each having (a) a plurality of transistors and (b) an identical design in a plurality of layers only up to and including a first metal layer, wherein at least one upper metal layer above said first metal layer is configured to interconnect (i) a first plurality of said transistors to form a mixed-signal module and (ii) a second plurality of said transistors to form a digital module, said mixed signal module generating at least one analog signal and at least one digital signal, wherein each of said cells comprises (i) five of said transistors, (ii) two well contacts and (iii) eleven pads in said first metal layer connected to each node of said transistors and each of said well contacts respectively.

13. The chip according to claim 12, wherein said chip further comprises an input/output region surrounding said array of cells.

14. The chip according to claim 12, wherein said at least one upper metal layer is further configured to interconnect a third plurality of said transistors to form an analog module.

15. The chip according to claim 14, wherein said mixed-signal module and said digital module are interconnected only in said upper metal layers.

* * * * *